United States Patent
Delsman et al.

(10) Patent No.: US 7,838,101 B2
(45) Date of Patent: Nov. 23, 2010

(54) RIBBON BONDING TOOL AND PROCESS

(75) Inventors: Mark Arnold Delsman, Irvine, CA (US); Christoph Benno Luechinger, Irvine, CA (US)

(73) Assignee: Orthodyne Electronics, Inc., Irvine, CA (US)

( * ) Notice: Subject to any disclaimer, the term of this patent is extended or adjusted under 35 U.S.C. 154(b) by 0 days.

(21) Appl. No.: 12/535,928

(22) Filed: Aug. 5, 2009

(65) Prior Publication Data

US 2009/0297786 A1  Dec. 3, 2009

Related U.S. Application Data

(62) Division of application No. 12/103,284, filed on Apr. 15, 2008, and a division of application No. 11/044,695, filed on Jan. 27, 2005.

(51) Int. Cl.
 *B32B 3/00* (2006.01)
 *H01L 23/48* (2006.01)

(52) U.S. Cl. .................. 428/172; 428/212; 428/213; 257/784; 228/4.5

(58) Field of Classification Search .......... 428/157, 428/172, 212, 344, 213; 257/784; 228/4.5, 228/110.1, 180.5
See application file for complete search history.

(56) References Cited

U.S. PATENT DOCUMENTS

| | | | |
|---|---|---|---|
| 3,670,394 A | 6/1972 | Daniels et al. | |
| 4,460,634 A | 7/1984 | Hasegawa | |
| 4,687,693 A | 8/1987 | Sheyon et al. | |
| 4,776,509 A | 10/1988 | Pitts et al. | |
| 5,314,105 A | 5/1994 | Farassat | |
| 5,550,326 A | 8/1996 | Kesel | |
| 5,816,472 A | 10/1998 | Linn et al. | |
| 5,868,301 A | 2/1999 | Distefano et al. | |
| 6,523,732 B1 | 2/2003 | Popoola et al. | |
| 6,562,166 B2 | 5/2003 | Molander et al. | |
| 6,824,630 B2 | 11/2004 | Oishi et al. | |

(Continued)

FOREIGN PATENT DOCUMENTS

EP  0506112  9/1992

(Continued)

OTHER PUBLICATIONS

Bryan Ong et al.; "Heavy Al Ribbon Interconnect: An Alternative Solution For Hybrid Power Packaging"; R&D2/Relaibility Engineering; (no date).

*Primary Examiner*—Donald Loney
(74) *Attorney, Agent, or Firm*—Haynes and Boone, LLP.

(57) ABSTRACT

An ultrasonic bond is formed using a bond tool foot having a waffle shape of thin protrusions and gaps between the protrusions. The tool is brought in contact with the ribbon to a depth to create depressions in a ribbon approximately 150 μm or less from the underlying bonding surface. The tool is then brought down further into the ribbon to contact the portions of the ribbon between the depressions, such as an additional 25 to 50 μm. The result is lightly bonded regions underneath the groove portions and highly bonded regions underneath the protrusions and around the perimeter of the bond. In another embodiment, an ultrasonic bond is formed along a partial width of a ribbon.

12 Claims, 6 Drawing Sheets

U.S. PATENT DOCUMENTS

| | | |
|---|---|---|
| 7,230,322 B2 * | 6/2007 | Funato et al. ............... 257/666 |
| 2004/0217488 A1 | 11/2004 | Luechinger |
| 2006/0065697 A1 | 3/2006 | Kobae et al. |
| 2006/0163315 A1 | 7/2006 | Delsman et al. |
| 2006/0180635 A1 | 8/2006 | Lim et al. |

FOREIGN PATENT DOCUMENTS

| | | |
|---|---|---|
| JP | 05021541 | 1/1993 |
| JP | 05235117 | 9/1993 |
| JP | 2002-313851 | * 10/2002 |

* cited by examiner

≥100 μm Groove Depth
100 μm Waffle Squares

FIG. 5

45 μm Groove Depth
130 μm Waffle Squares

RIBBON BONDING TOOL AND PROCESS

This application is a divisional of U.S. patent application Ser. No. 12/103,284, filed Apr. 15, 2008, which is a divisional of U.S. patent application Ser. No. 11/044,695, filed Jan. 27, 2005, which is herein incorporated by references for all purposes.

BACKGROUND

1. Field of the Invention

The present invention relates to bonding of semiconductor devices, and in particular, to tools and processes for ultrasonic ribbon bonding.

2. Related Art

In the manufacture of semiconductor devices, active elements in a semiconductor device, such as drain and/or source regions in a semiconductor die, are electrically connected to other devices or electronic components, such as on a printed circuit board. Typically, the connection is made by bonding, e.g., ultrasonically bonding, a conductive wire between the two portions. The wire can be made from gold, aluminum, or copper, with typical diameters from 12 μm to 500 μm. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of wire bonding techniques have been developed, and one which has been particularly successful is a micro-welding technique using ultrasound. Aluminum wire, in contact with the surface to which it is to be bonded, is moved rapidly in the direction of the surface to which it is to be bonded, so that its oxide layer breaks open. The wire is then subjected to pressure, and a permanent joint is created between the two materials. Motion of the wire is generated by an ultrasonic transducer excited by an ultrasonic generator to produce high-frequency mechanical vibrations.

One type of ultrasonic wire bonding uses a wedge bonding tool. The ultrasonic energy is directed to the aluminum wire by the wedge tool. The wire is fed through a guide at the bottom of the wedge. The wire is then pressed down with a small defined force to slightly deform the wire. Ultrasonic energy is then switched on, and the bonding process starts. During this time, the wire portion under the bond tool is deformed, primarily widened, with the actual change in shape depending on the size and the physical properties of the wire, the bond tool geometry, and the process parameter settings.

The deformation of the wire causes an extension of its surface, which is largest along the perimeter of the wire portion under the bond tool, and thus, bond formation starts there. From there the bonded area progresses inward, but typically leaves some portions of the interior unbonded or lightly bonded, i.e., the wire is not bonded completely or fully to the surface. Thus, not only must the wire deform sufficiently, but also the surface of the substrate the wire is bonded to. Because an ultrasonically created joint is based on the formation of bonds on the atomic level, an intimate material contact is a requirement for the formation of a strong bond, which itself is a requirement for a reliable bond.

In addition to wires, flexible conductive ribbons can be used to electrically connect two bonding areas. Compared to round wires, wide and thin ribbons allow bonding larger cross sections and creating larger contact areas. Ultrasonic bonding can also be used to connect the ribbon to a bonding surface. However, for the round wire's geometry, the surface extension is much more extensive with limited bond parameters (e.g., force and power) than for bonding rectangular ribbon. This makes it easier to create highly reliable bonds with round wire.

Figure 1A:
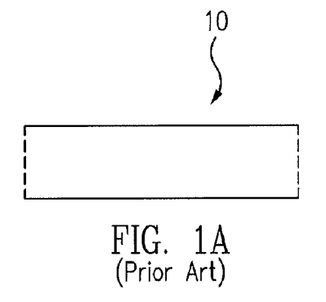
FIGS. 1A to 1D are top views of different stages of a ribbon bond using conventional ultrasonic bonding.
Figure 1B:
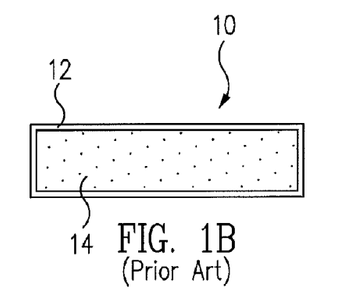
Figure 1C:
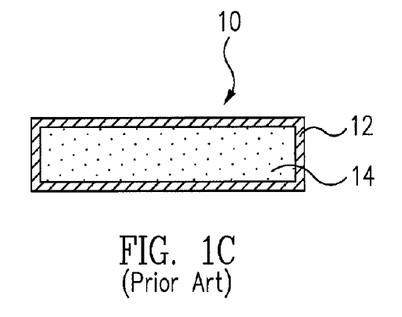
Figure 1D:
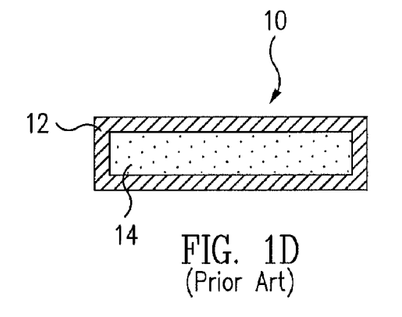
Figure 2:
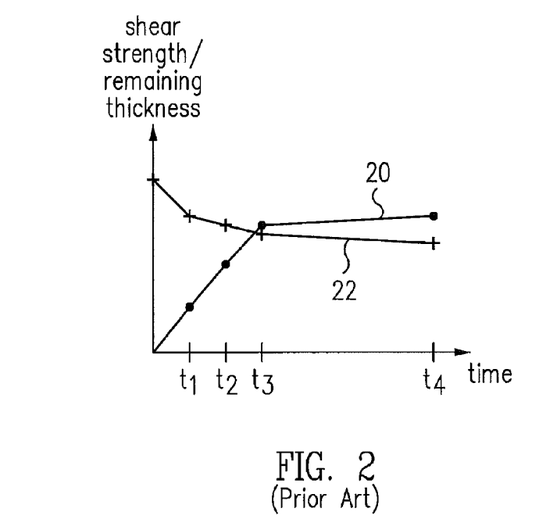
FIG. 2 is a graph showing shear strength and remaining thickness of the bonded portion of the ribbon, as a function of time for the bond of FIG. 1.

FIGS. 1A to 1D show top views of different stages of a ribbon bond using ultrasonic bonding. Ultrasonic bonding of rectangular ribbons follows a similar process and behavior to wires. In FIG. 1A, a top view of a portion of a ribbon bond 10, as for example seen after shearing off the ribbon, is shown. The tool begins to deform and bond the ribbon to the surface, as shown in FIGS. 1B and 1C, with the bond spreading inward. Typically a perimeter 12 of the ribbon bond 10 is strongly bonded, while a central area 14 of the bond is only lightly bonded, because there the surface extension is limited and exposure of clean ribbon and substrate material less likely. FIG. 1D shows a typical completed bond, with the edges more strongly bonded than the interior portions. FIG. 2 is a graph showing shear strength 20 and remaining ribbon thickness 22 as a function of (bond) time. The remaining thickness is defined here as the initial thickness minus the deformation. The four time points represent the bond at stages shown in FIGS. 1A to 1D, respectively.

Figure 3A:
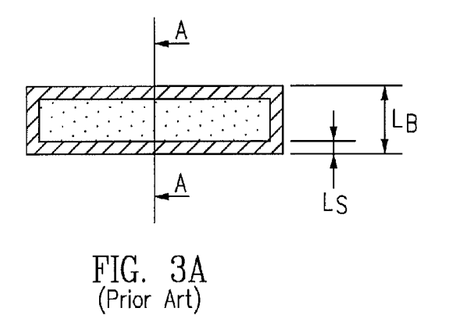
FIG. 3A is a top view of a completed conventional ribbon bond.
Figure 3B:
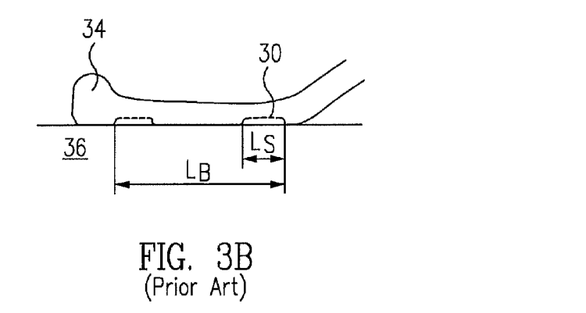
FIG. 3B is a side view of the bond of FIG. 3A along sectional line A-A.

The characteristics of ultrasonic ribbon bonding, discussed above, are supported by the failure behavior of such bonds under thermo-mechanical stresses caused during thermal cycling, as shown in FIGS. 3A and 3B. FIG. 3A shows a top view of a completed bond, similar to FIG. 1D above, where $L_B$ is the length of the bond and $L_S$ is the width of the strongly bonded area around the perimeter. FIG. 3B shows a side view of the bond of FIG. 3A along sectional line A-A, with the bonded ribbon still in place. Cracks 30 can start at the perimeter of the bond, where stresses caused by the mismatch between the coefficients of thermal expansion of the ribbon 34 and substrate material 36 are highest. As the joint is strong at the perimeter, the cracks are diverted from the (bond) interface into the ribbon, where their propagation is continuous but slow. After the cracks have passed this strong area, they move back to the bond interface. There they progress quickly until they meet in the center of the bond, causing a complete lift-off of the ribbon. Because of the rectangular area of the bond (wide but short), its length is the limiting dimension, being the shorter distance over which the cracks can move until they meet in the center of the bonded area.

Figure 4:
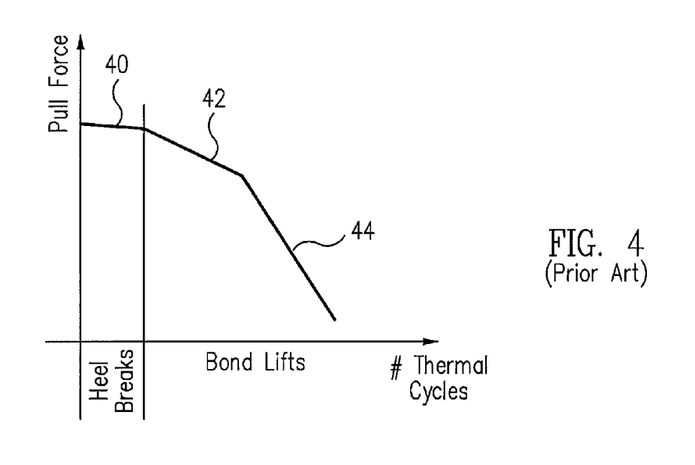
FIG. 4 is a graph showing pull force measurements as a function of the number of thermal cycles.

FIG. 4 is a graph showing pull force measurements as a function of the number of thermal cycles. During a first phase 40, the strength of the heel, which is the weakest element of the bond (after bonding), especially if it had been slightly damaged due to (vertical) deformation of the ribbon, begins to degrade slowly. During a second phase 42, the bond's degradation increases, as the pull test failure changes from heel break to bond lift. This failure mode transition may occur because under thermal or power cycling the bond interface degrades quicker than the heel. When the cracks have passed the perimeter area and have moved back to the interface, the degradation rate again increases due to the low strength of the bond in this area during a third phase 44.

For ultrasonic (wire and ribbon) bonds, it is typically observed that the crack propagation rate decreases with increasing bond deformation, which is typically achieved with increasing "bond intensity" (mainly ultrasonic power, bond force). Increasing bond deformation is advantageous regarding a bond's lifetime, i.e., reliability, but in general is achieved by weakening the bond's pull strength, due to damage created to the heel.

The lifespan of a wire or ribbon bond under thermal cycling depends on the crack propagation rate and the distance the crack needs to propagate until the bond lifts off, i.e., the cracks meet somewhere in the middle of the bonded area. Consequently, the lifespan of a bond, and therefore its reliability, can be extended by increasing the distance the crack needs to propagate, by either increasing the length of the bond, and/or decreasing the crack propagation rate, i.e., by increasing the strongly bonded area towards the inner portion of a bond, and/or increasing the strength of the bond there. The latter two improvement factors require creating more locations with sufficient/significant deformation to disrupt the surface, preferably without having to increase the process parameters (force and power) significantly, and without having to severely change the shape (i.e., the aspect ratio of the cross-section of the ribbon) of the ribbon, i.e., without having to severely deform it.

Accordingly, there is a need for an improved bonding tool and process for ultrasonic bonding, which overcomes the deficiencies in the prior art as discussed above.

SUMMARY

According to one aspect of the present invention, a method for ultrasonic bonding includes first applying bond force and ultrasonic vibration to the ribbon (or wire) only to specific areas of the ribbon to quickly deform and create bonded spots at those depressed areas. The bonding then continues by pushing or driving the tool further into the ribbon such that all areas of the ribbon, including areas between the depressions deform and create a bond over the entirety of the ribbon bond area. The result is a bond that has high strength bonded areas in the depressed areas and possibly lighter strength bonded areas between the depressed areas. Further, the stronger bonded areas are evenly distributed throughout the entire bond.

In one embodiment, a bonding tool for use in processes of the present invention has a waffle-shaped pattern, where the foot of the tool comprises a pattern of long protrusions (or teeth) and the areas between the teeth (i.e., the grooves) are relatively wide. For example, the ratio of tooth width to groove width is less than 1.0.

In one embodiment, the tool foot structure is designed such that the teeth can quickly (after applying ultrasonic vibrations) penetrate the ribbon material to deform the ribbon under the teeth to a thickness of approximately 100 μm or less. This creates bonded spots of high strength under the teeth, instead of a weaker bonded area spread over the complete tool foot, which is the case for conventional bonding. After the teeth have penetrated a distance greater than the groove depth of the tool, i.e., the ribbon now contacts the complete surface area of the tool, the ultrasonic power and force are spread over the complete area of the tool foot. This causes the bonded area to grow into the spaces between the initially bonded spots. But because of the lower power and force density, resulting in a lower material shear flow, the bond strength in these areas could be weaker. However, this does not cause a problem, especially if the ribbon in the areas between the teeth is in direct contact with the substrate. Even if the local bond strength in these areas is rather weak, the joint will not delaminate in these areas, as long as they are surrounded by intact strongly bonded depression areas.

Thus, advantages of the present invention include creation of bonds that are stronger and therefore more reliable under thermal cycling, bonds of equal length and width but different (ribbon) thickness with virtually the same parameters regarding ultrasonic power and bond force, i.e., with parameters that increase much less than proportional to the ribbon's thickness, and larger bonds, especially longer bonds than capable with traditional tools (under force/power constraints of a specific bonder system). In other words, the invention allows achieving (1) bonds with better reliability (under thermal and power cycling), (2) a significant reduction of the dependence of the bond parameters on ribbon thickness, and therefore a scaling to thicker ribbons, (3) a wider process window, (4) larger contact areas from larger tool foot sizes and (5) larger contact areas from multiple adjacent bonds ("continuous bond").

According to another embodiment, an ultrasonic bond is formed on a ribbon, wherein the bond does not extend the complete width of the ribbon. In one embodiment, the shape of the bond is circular, and in another embodiment, the shape of the bond is square. With wider ribbons, such as 3 mm, an effective bond can be made in the interior portion, such as the inner 1.5 or 2 mm. Under limited bond force and power requirements, it may be advantageous to not bond the complete width of the ribbon. To a first order, the crack growth rate within a bond along and perpendicular to the ribbon is the same. Therefore, a square or round bond instead of a rectangular one would be a more optimized shape in applications where the length of the bond is not dictated by space restrictions. Not bonding the complete width of a ribbon does not cause a disadvantage or problem from either a performance or a reliability aspect. Consequently it is also possible to partially bond even wider ribbons, as long as the contact area is large enough to allow the large current flow possible through the larger ribbon cross section. This method also enables using and bonding such wide ribbons which would cause planarity related issues when bonded across their complete width.

This invention will be more fully understood in conjunction with the following detailed description taken together with the following drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

Figure 5:
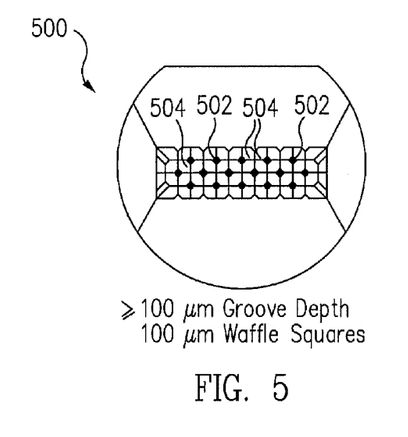
FIG. 5 is a bottom view of a bonding tool according to one embodiment of the present invention.
Figure 6:
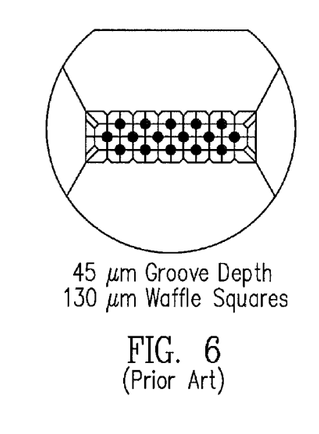
FIG. 6 is a bottom view of a conventional bonding tool.

According to one aspect of the present invention, a bonding tool for ultrasonic bonding comprises a bond foot having deeper grooves and narrower or thinner teeth or protrusions, as compared with conventional waffle tools. FIG. 5 is a bottom view of a bonding tool 500 according to one embodiment. Bonding tool 500 includes a plurality of teeth or protrusions 502 and a plurality of grooves 504 between teeth 502. In one embodiment, the depth of grooves 504 (or the length of teeth 502) is approximately greater than 100 µm, and the width of teeth 502 is approximately 100 µm. This allows more effective ribbon bonding by bringing the teeth closer to the bond interface before the bond tool contacts the remaining portions of the ribbon, as will be discussed in more detail below. Conventional waffle bonding tools, such as that shown in FIG. 6, have shallower grooves (or shorter teeth) (e.g., 45 µm) and larger teeth (e.g., 130 µm). Thus, an exemplary bonding tool of the present invention has teeth that are more than two times as long as conventional waffle patterns and has a reduced initial contact area between the tool and the ribbon.

Figure 7A:
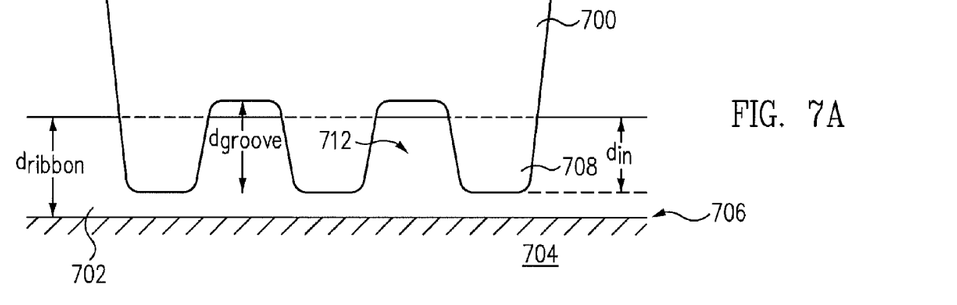
FIGS. 7A and 7B are side views of two stages in the bonding process of the present invention according to one embodiment using a bonding tool, such as that of FIG. 5, and a conductive ribbon.
Figure 7B:
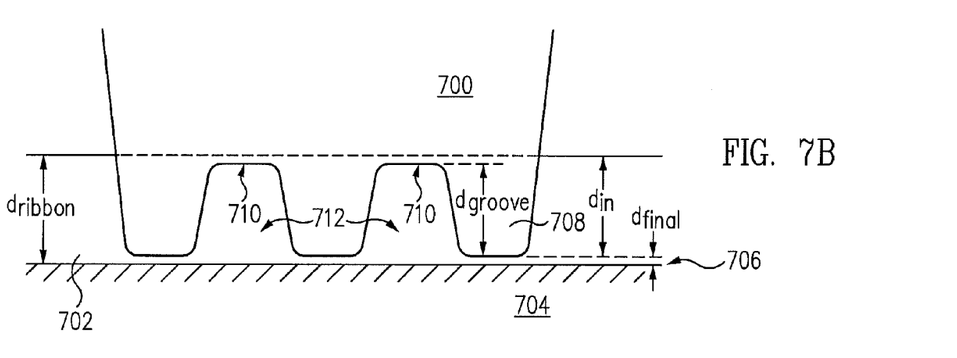

FIGS. 7A and 7B show two stages in a bonding process of the present invention using a bond tool 700, such as the one shown in FIG. 5. At a first stage, shown in FIG. 7A, bonding tool 700 is brought in contact with a conductive ribbon 702, such as disclosed in commonly-owned U.S. application Ser. No. 10/429,128, filed May 2, 2003, entitled "Ribbon Bonding", which is incorporated by reference in its entirety. Ribbon 702 will be bonded to an underlying contact 704 at a surface interface 706. Teeth 708 first come in contact with ribbon 702, where both an ultrasonic vibration and a bonding force are applied. Bonding tool 700 continues to be brought down into ribbon 702 such that the portions of the ribbon underlying teeth 708 are deformed. Because teeth 708 are thinner than conventional teeth, the ribbon can be quickly deformed with less energy and force. At a second stage, shown in FIG. 7B, as bond tool 700 continues to be brought down into ribbon 702, a bottom portion 710 of grooves 712 contacts ribbon 702 and deforms those portions as the tool is brought down further into the ribbon. At the end of the second stage, deformed portions of the ribbon underlying both the teeth and the groove bottoms are bonded, with the portions underlying the teeth and an area along the outside of the perimeter of the teeth more highly bonded than those underlying the groove bottoms.

Thus, at the first stage, the depth of penetration, $d_{in}$, into ribbon 702 is less than the depth, $d_{groove}$, of groove 712 and less than the thickness, $d_{ribbon}$, of ribbon 702. In this stage, the bond force and ultrasonic vibration are concentrated to the "tooth" areas, causing significant deformation and bond pressure, resulting in the quick formation of bonded spots with high strength. It is noted that the deformation caused by a tooth is not limited to the tooth area, but spills over into the groove area. Thus, the area below the tooth area and areas extending outwardly from the tooth area together form a bond with higher strength in the interior portion. During the second stage (shown in FIG. 7B), the depth of penetration $d_{in}$ is more than the depth of the groove $d_{groove}$, but less than the ribbon thickness $d_{ribbon}$. The bond force is now distributed over the complete tool foot area, and the space between the spots with high bond strength is also joined. However, because the deformation or penetration of the bottom of the groove into the ribbon is small, these bond areas may have lower strength than the bond areas underneath the teeth.

Consequently, the length of teeth 708 (or the depth of grooves 712 in the tool foot) is chosen such that at completion of the bond, the bottom of teeth 708 is very close to the bond interface 706, independent of the initial thickness of the ribbon, as shown by $d_{final}$, in FIG. 7. In one embodiment, $d_{final}$ is less than 100 µm (e.g., 50 µm). This minimizes the local thickness of the ribbon material between the tool and the bond surface. Further, the distance that the bottom of grooves 712 travels into the ribbon is small, e.g., 25 to 50 µm. The thinner the ribbon (or wire), the lower the required ultrasonic power and bond force to form a bond of specific strength (for example, expressed as shear force per area). Less ultrasonic energy (vibration amplitude) is required to soften the thinner aluminum layer, and less force is required to deform the ribbon to a desired degree.

Deformation is equal to $d_{in}$, i.e., the depth or distance the tool sinks into the ribbon. For the new tool design this is mainly a local, vertical deformation, which does not significantly deform the overall cross section of the ribbon. This is a "good" deformation, as it causes strong, albeit only local, bonding, without damaging the ribbon. We may call this deformation local deformation. From a process viewpoint it is this deformation which is typically measured on a machine with a sensor that records the change in tool height as a function of (bond) time (as it is also shown in the FIGS. 2 and 10). When the tool sinks a distance>$d_{groove}$ into the ribbon, the overall cross section of the ribbon becomes significantly deformed, vertically, but also horizontally, and the aspect ratio of its cross section is changed. This deformation is equal to $d_{in}-d_{groove}$, (see FIG. 7B). It causes an overall deformation, which reduces the overall thickness of the bonded portion of the ribbon. The vertical deformation causes damage to the bond's heel, and is therefore disadvantageous. It also causes a horizontal deformation, along the ribbon and in the form of squash to the sides of the bond. This overall deformation is a "bad" deformation, and should be kept minimal. Thus, as used and defined herein, a local deformation is in the depressions, and an overall deformation is of the bonded part of the ribbon as a whole.

Figure 8A:
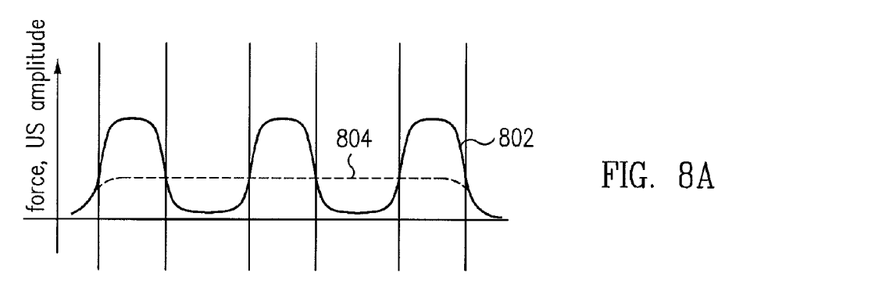
FIGS. 8A and 8B are graphs showing force and material shear flow, respectively, as a function of bond location for the bond of FIG. 7.
Figure 8B:
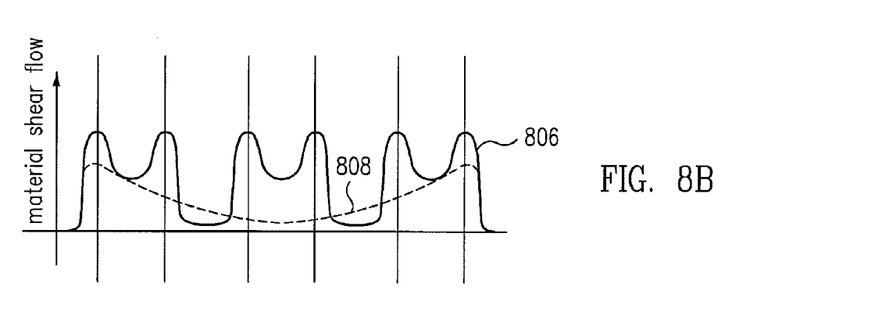

FIGS. 8A and 8B are graphs showing force and material shear flow, respectively, as a function of bond location. FIG. 8A shows, at curve 802, the force distribution at the first stage, i.e., when $d_{in}<d_{groove}$. As expected, the force is largest in portions corresponding to teeth 708 and lowest in portions corresponding to grooves 712, since the groove portions have not yet begun to deform the ribbon. Curve 804 shows the force distribution at the second stage, i.e., $d_{in} \geq d_{groove}$. Here, the force is approximately the same across the ribbon, as both the teeth and groove portions are contacting and deforming the ribbon. FIG. 8B shows the material shear flow during the first stage when $d_{in}<d_{groove}$ at curve 806 and during the second stage when $d_{in} \geq d_{groove}$ at curve 808.

Figure 9A:
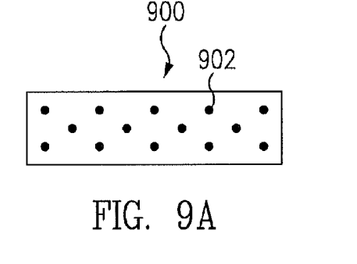
FIGS. 9A-9D are top views of different stages of a ribbon bond (for example as seen after shearing off the bonded portion of the ribbon) using ultrasonic bonding according to one embodiment of the present invention.
Figure 9B:
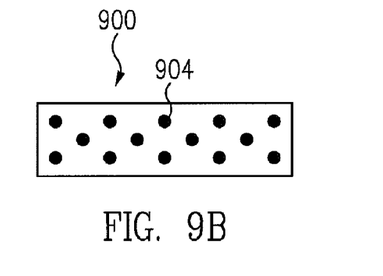
Figure 9C:
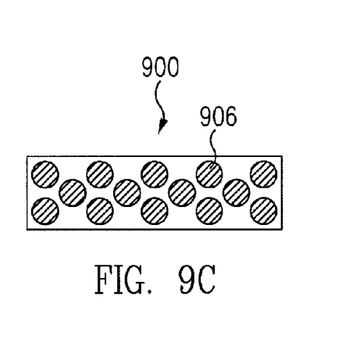
Figure 9D:
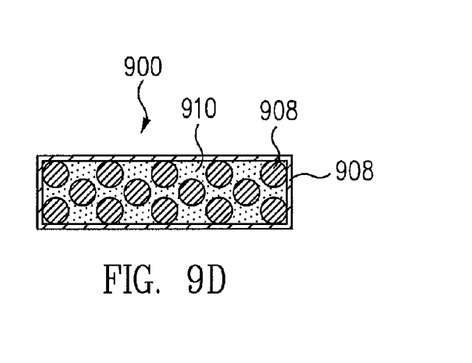

FIGS. 9A-9D show different stages of a ribbon bond using ultrasonic bonding according to one embodiment of the present invention. In FIG. 9A, a top view of a portion of a bond area 900 is shown. At time t1, during the first stage, the waffle tool is brought into contact with the ribbon with both a bonding force and ultrasonic energy. The teeth of the bond tool first contact and deform the ribbon, creating isolated bond spots 902 in the bonded area 900. As the bond tool is depressed further into the ribbon at time t2 (shown in FIG. 9B), the ribbon becomes more deformed and the isolated bond spots 904 under the tool's teeth grow in size (diameter). At time t3 in FIG. 9C, the groove bottoms begin to contact the ribbon and the isolated bond spots 906 below the teeth reach a maximum size. Thus, at time t3, the grooves in the bonding tool are "filled" with the ribbon. Time t4, shown in FIG. 9D, represents the second stage, where the bottom portion of the grooves have traveled a short distance into the ribbon and caused the area underlying the grooves to be lightly bonded. So, at time t4, strong bonds 908 are formed corresponding to the teeth and perimeter, and weaker bonds 910 are formed corresponding to the grooves.

Figure 10:
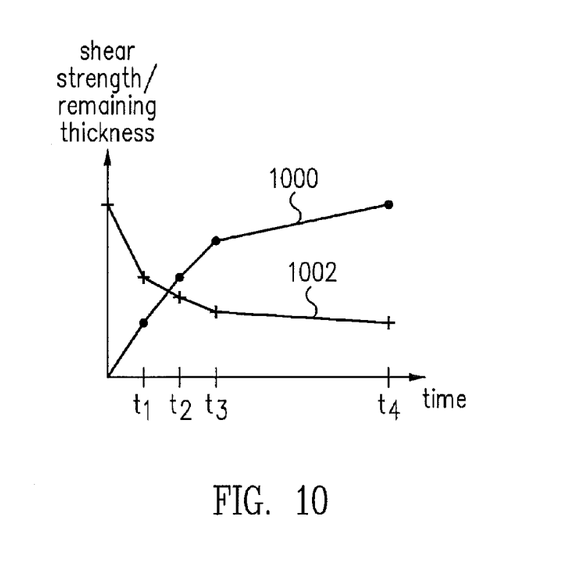
FIG. 10 is a graph showing shear strength and remaining thickness as a function of time.

FIG. 10 is a graph showing shear strength 1000 and remaining thickness 1002 as a function of time. The remaining thickness is defined here as the initial thickness minus the deformation. The four time points represent the bond at stages shown in FIGS. 9A to 9D, respectively. Comparing FIG. 10 with FIG. 2, it is seen that the present invention facilitates significant deformation and bond pressure underneath the teeth, resulting in quick formation of bonded spots with high strength, as compared to a conventional bond (shown in FIG. 2).

Referring back to FIG. 9D, the reliability or strength of such a bond is better as cracks need to traverse longer distances through strongly bonded areas 908 in both directions. This is especially true for a tool with longer foot and/or having several rows of teeth. The areas with lower bond strength, i.e., portions 910, will not crack as long as the strong bond spots around the lightly bonded areas are intact. Thus, the overall lifespan of such bonds is extended.

Figure 11A:
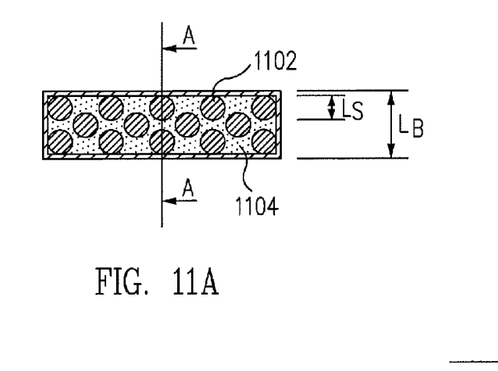
FIGS. 11A and 11B are a top view and a side view along sectional line A-A, respectively, of a completed bond according to one embodiment.
Figure 11B:
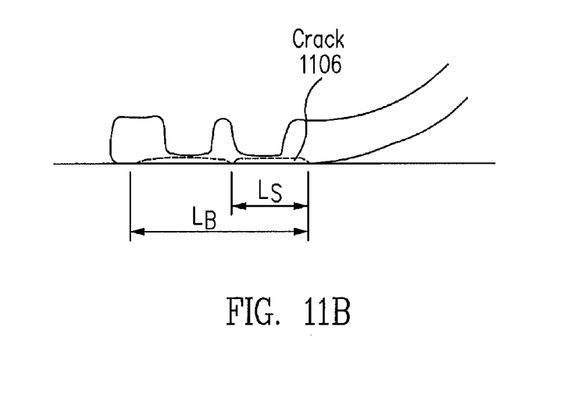

Furthermore, the degradation rate of bonds of the present invention is less than conventional bonds. FIGS. 11A and 11B are a top view and a side view along sectional line A-A, respectively, of a completed bond, similar to FIG. 9D above. LB is the length of the bond and $L_S$ is the diameter of a strongly bonded portion 1102. Lightly bonded portions 1104 are shown between strongly bonded portions 1102. Cracks 1106 are shown in FIG. 11B. As discussed above, with conventional bonds, the cracks propagate quickly to cause a complete lift off of the ribbon, due to the bond perimeter being the only portion that is strongly bonded. However, with the present invention, numerous interior portions along with the perimeter are strongly bonded, as seen in FIG. 11A. This results in a more reliable bond.

Figure 12:
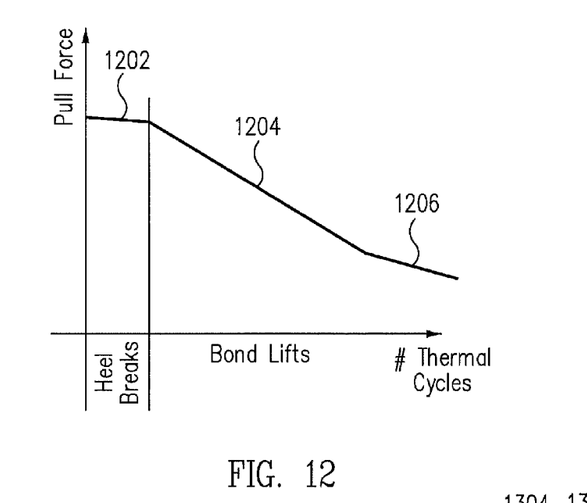
FIG. 12 is a graph showing pull force measurements as a function of the number of thermal cycles for a bond of the present invention.

FIG. 12 is a graph showing pull force measurements as a function of the number of thermal cycles for a bond of the present invention. This can be compared with the graph of FIG. 4 showing a conventional bond. During a first phase 1202, the bond strength at the heel begins to degrade slowly, similar to the performance of conventional bonds (FIG. 4). During a second phase 1204, the degradation increases, and the pull test failure changes from heel break to bond lift, because the bond interface degrades quicker than the heel. Here, the duration of degradation rate 1204 is longer than for conventional bonds (compare degradation rate 42 of FIG. 4) because there are strong bonds at both the perimeter and the interior portions. The closer the cracks come to the center of the bond, the lower the local stress caused by the thermal mismatch between the aluminum ribbon and the substrate. Together with the high strength of the strong bonds also in the central region, this will slow down the crack growth, and result in a reduced degradation rate 1206. Thus, the strong bonds at the interface corresponding to both the perimeter and the teeth portions combine to decrease the overall degradation rate and increase the lifespan of the bond, i.e., the reliability of the bond.

In one embodiment, the length of the bonding tool foot is approximately 500 to 875 µm for bonding 1.5 and 2 mm wide ribbons. For narrower ribbons, the length of the tool foot can be shorter. However, for a given ultrasonic system, the foot length could be chosen longer to create a larger contact area and a bond with longer lifespan. The cross-section of the teeth depends on the penetration depth and is approximately 0.01 mm$^2$ in one embodiment. In some embodiments, the teeth have a tapered cross-section, while in other embodiments, the teeth have a uniform cross-section. The length of the teeth depends on the ribbon thickness, with the thicker the ribbon, the longer the teeth. In one embodiment, the tooth length is approximately 75 to 150 µm less than the ribbon thickness. This allows quick deformation to within approximately 50 to 100 µm from the bond interface, with 25 to 50 µm penetration of the grooves to "fill the gaps".

With a tooth length adjusted to the specific ribbon thickness, bond spots with high joint strength can be created somewhat independent of the ribbon thickness. This allows creating strong reliable bonds with thicker ribbons without having to increase the process parameters (e.g., force and ultrasonic power) proportional to the ribbon thickness, and without having to increase the overall deformation of ribbons with increasing thickness, to achieve a specific bond strength and reliability. Because the area of the teeth is only a small fraction of the total bond foot area, the tool design of the present invention also allows creating strong reliable bonds with lower process parameters, or creating larger, especially longer, bonded areas, not possible with standard tools under the (force and power) limitations of a given ultrasonic system.

Another benefit of the present invention is the limited overall deformation of the bond (i.e., more vertical deformation in localized areas under and around the teeth without causing significant horizontal deformation, i.e., ears or squash sidewise) required to achieve a strong reliable bond. This reduces damage to the heel, making this part of the interconnect initially stronger, and therefore longer lasting, especially under load conditions which are more harsh to the heel than thermal or power cycling.

Figure 13:
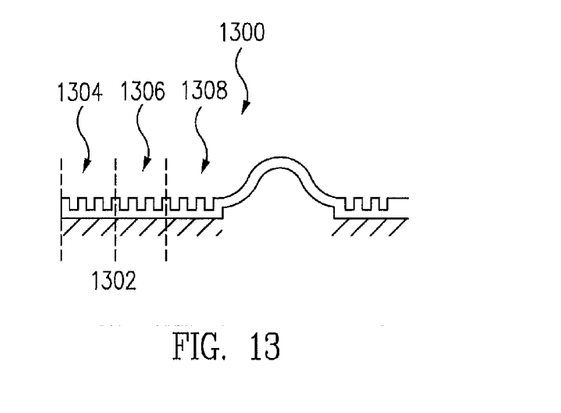
FIG. 13 is a side view of a ribbon that has been bonded using three adjacent bonds.

The limited horizontal deformation of the bond also enables placing multiple bonds near to each other, creating a "continuous bond", as shown in FIG. 13. FIG. 13 is a side view of a ribbon 1300 that has been bonded to an underlying surface 1302 using three bonds 1304, 1306, and 1308. Each bond is formed using the present invention in a series of three sequential bonding steps. In other words, the bond tool was brought down onto ribbon 1300 three separate times with bonding force and ultrasonic power to form the three bonds. This is beneficial to create large, specifically long-bonded areas despite a limited length of the bond tool foot. Large contact areas are important to reduce the spreading resistance in the metallization of MOSFETs, in order to minimize their on-state resistance. Because the length of the tool foot is typically limited, for example by the space available on the t-post in a discrete power package and/or the power and force capabilities of the system used, this offers a highly flexible alternative to create large bonded areas. Therefore, while in many applications a bonded area with rectangular shape is required, a square (or ideally round) bonded area should be optimal with regards to reliability, due to the equal travel distance for cracks from the side, front, and back. Thus, the present invention allows multiple (two or more) bonds to be formed sequentially to create a large bond. This is not possible with conventional tools since continuous bonding with conventional tools causes significant horizontal disruption/deformation that can damage or interfere with previously-bonded adjacent bonds.

Another benefit of the strong bond spots is related to the crack location in a strongly bonded area. As such cracks propagate inside the ribbon, the residues on the die metallization act like an increased metallization thickness. On the metallization of a (silicon) die this still keeps the electrical sheet/spreading resistance low because the residue's thickness is typically several times thicker than the initial die metallization layer (e.g., 3 to 5 µm). Therefore, although cracks in the outer area of the bond are present and the joined cross section is reduced, the electrical functionality of such a bond is not significantly degraded in the later phase of its lifetime, and extending the bond's lifetime in such a partially cracked condition is valuable. The strongly bonded interior portion thus maintains the electrical functionality and therefore usefulness of the bond for a longer period of time than bonds formed conventionally.

Thus, in summary, the tool and process for ultrasonic bonding discussed herein offers numerous benefits. Bonds formed have reduced overall bond deformation (during the final phase of the process), resulting in reduced damage to the heel compared to bonding with a tool with a flat or nearly flat tool foot. Consequently, higher pull strength and improved reliability are obtained under conditions, which primarily stress the heel area of the bond (mechanical relative motion of the first and second bond, for example when the two bonds are on different substrates, or vibrations which move the loop relative to the two bonds). Another advantage is an increased lifetime of the bond. The strength around the perimeter is not (much) reduced compared to a bond created with a standard tool. However, the inside area is much stronger, causing the degradation of the bond strength and bonded area to be significantly reduced in the later stage of the bond's lifetime.

Furthermore, the bond process becomes less sensitive to the thickness of the ribbon because the critical bonding always takes place under similar conditions (extension to thicker ribbon without the need for a more powerful system). Tools with a larger/longer bond foot can thus be used (under force/power constraints of a specific bonder system), increasing the lifetime/reliability of the interconnect (extension to larger bonds without the need for a more powerful system). Longer bonds, i.e., bonds with a lower aspect (width/length) ratio, have a longer lifetime because the cracks in the bond in the direction along the ribbon, i.e., the smaller dimension of the bond, have a longer path to propagate.

The present invention also allows a wider process window. An overall strong bond with reliable sticking is created at lower bond parameters. This can result in reduced sensitivity to device clamping especially in lead frame based applications. The formation of large continuous bonded areas by placing multiple bonds close enough together is enabled.

Figure 14A:
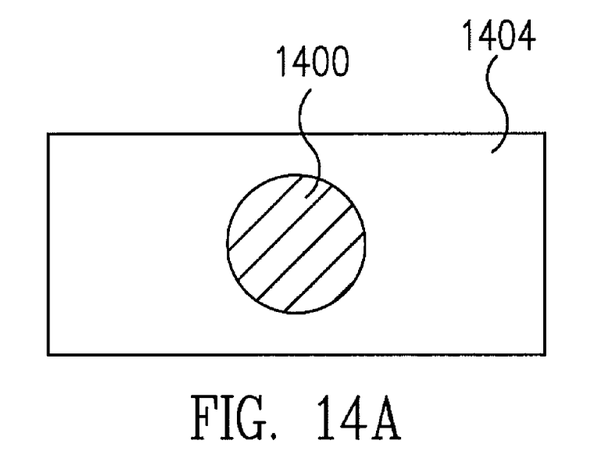
FIGS. 14A and 14B are top views of bonds according to other embodiments of the invention.
Figure 14B:
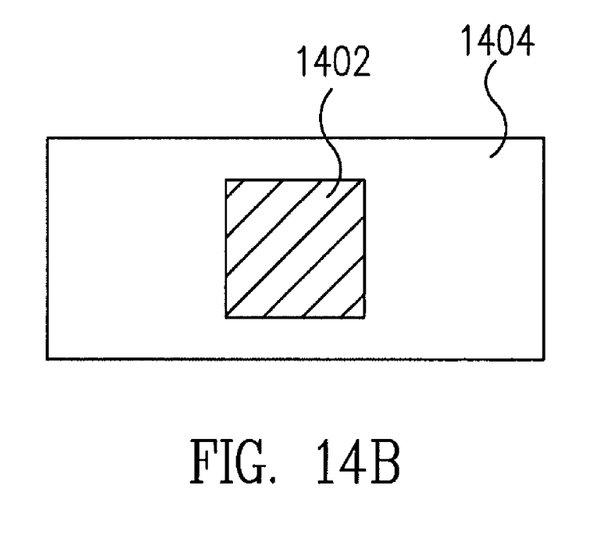

FIGS. 14A and 14B are top views of a completed bond according to another embodiment of the present invention. In contrast to the bonds of FIGS. 9D and 11A, the bond in FIGS. 14A and 14B is not completely bonded along the width of the ribbon. With the above embodiments, the bond is long with an aspect ratio close to one, which results in cracks having to travel a longer distance along the bond. Consequently, the bond is more reliable. However, there are situations where the bond force and power are limited, which may preclude easily forming the longer bonds that are completely bonded along the width. Thus, instead of using the limited bond force and power to form a short wide bond, a long narrower bond may be formed. The long narrow bond may be more reliable than a short wide bond because the cracks need to travel a longer distance before bond failure. Thus, with wider ribbons, a partial bond along the width may be desirable. In FIG. 14A, a bond 1400 is approximately round, while in FIG. 14B, a bond 1402 is approximately square. Other shapes may also be suitable, as long as the bond power and force are not used to completely bond along the width of the ribbon. In one embodiment, bonds 1400 and 1402 are formed on a ribbon 1404 that is greater than 2 mm wide, e.g., 3 mm. So, as an example, for a 3 mm wide ribbon, only the inner 1.5 mm are bonded instead of the complete 3 mm. The length of such a bond may be greater than 1 mm, such as 1.5 mm, depending on the available bond power and force. The partial bonds of this embodiment, i.e., bonds that have widths smaller than the ribbon width, may be produced with the tool of the present invention or other conventional bond tools.

The above-described embodiments of the present invention are merely meant to be illustrative and not limiting. It will thus be obvious to those skilled in the art that various changes and modifications may be made without departing from this invention in its broader aspects. For example, the ultrasonic bonding of a conductive ribbon is described above in detail. However, other types of bonding materials, such as large wires, may also be used. Therefore, the appended claims encompass all such changes and modifications as fall within the true spirit and scope of this invention.

What is claimed is:

1. A flexible conductive ribbon material bonded to an underlying surface, the flexible conductive ribbon material comprising:

an upper surface of the flexible conductive ribbon material including a first portion, a second portion, and a third portion, the third portion being defined by a plurality of indentations extending below the second portion; and a lower surface contacting the underlying surface, wherein the flexible conductive ribbon material has a first thickness between the first portion of the upper surface and the lower surface, a second thickness between the second portion of the upper surface and the lower surface, and a third thickness between the third portion of the upper surface and the lower surface, the first thickness being greater than the second thickness, and the second thickness being greater than the third thickness, wherein a first area of the flexible conductive ribbon material below the first portion is unbonded with respect to the underlying surface, a second area of the flexible conductive ribbon material approximately below the second portion is bonded to the underlying surface at a first strength, and a third area of the flexible conductive ribbon material approximately below the third portion is bonded to the underlying surface at a second strength, the second strength being greater than the first bond strength.

2. The flexible conductive ribbon material of claim 1, further comprising a perimeter bonded area surrounding the second area and the third area, the perimeter bonded area having a third strength greater than the second strength.

3. The flexible conductive ribbon material of claim 1, wherein the second area and the third area do not extend along a complete width of the flexible conductive ribbon material.

4. The flexible conductive ribbon material of claim 1 wherein a difference between the first thickness and the second thickness is between 25-50 µm.

5. The flexible conductive ribbon material of claim 3, wherein a bonded portion of the ribbon including the second area and the third area is approximately circular shaped.

6. The flexible conductive ribbon material of claim 3, wherein a bonded portion of the ribbon including the second area and the third area is approximately square shaped.

7. The flexible conductive ribbon material of claim 1 wherein the third thickness is approximately 100 μm or less.

8. The flexible conductive ribbon material of claim 1 wherein the plurality of indentations include tapered side wall portions formed using a bonding tool having tapered teeth.

9. The flexible conductive ribbon material of claim 1 wherein the plurality of indentations include substantially vertical side wall portions formed using a bonding tool having teeth with a uniform cross section along a length of each of the teeth.

10. The flexible conductive ribbon material of claim 1 wherein the flexible conductive ribbon material has a width greater than 2 mm.

11. The flexible conductive ribbon material of claim 1 wherein the flexible conductive ribbon material has a width of approximately 3 mm.

12. The flexible conductive ribbon material of claim 1 wherein the plurality of indentations have a depth of greater than 100 μm with respect to the second portion of the upper surface.

* * * * *